United States Patent
Mathew et al.

(10) Patent No.: US 9,640,466 B1
(45) Date of Patent: May 2, 2017

(54) PACKAGED SEMICONDUCTOR DEVICE WITH A LEAD FRAME AND METHOD FOR FORMING

(71) Applicant: FREESCALE SEMICONDUCTOR, INC., Austin, TX (US)

(72) Inventors: Varughese Mathew, Austin, TX (US); Sheila Chopin, Round Rock, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/051,917

(22) Filed: Feb. 24, 2016

(51) Int. Cl.
| | |
|---|---|
| H01L 21/00 | (2006.01) |
| H01L 23/495 | (2006.01) |
| H01L 21/48 | (2006.01) |
| H01L 21/56 | (2006.01) |
| H01L 23/31 | (2006.01) |

(52) U.S. Cl.
CPC .... *H01L 23/49513* (2013.01); *H01L 21/4825* (2013.01); *H01L 21/565* (2013.01); *H01L 23/3114* (2013.01); *H01L 23/4952* (2013.01); *H01L 23/49541* (2013.01)

(58) Field of Classification Search
CPC . H01L 2224/73265; H01L 2224/48247; H01L 2924/181; H01L 2224/85; H01L 21/4821

USPC ......... 257/666, 676, 784; 438/111, 112, 118, 438/123, 124
See application file for complete search history.

(56) References Cited

U.S. PATENT DOCUMENTS

| | | | | |
|---|---|---|---|---|
| 7,368,824 | B2* | 5/2008 | Hosseini | B23K 1/0016 257/779 |
| 8,723,198 | B2* | 5/2014 | Brunner | C09K 11/7701 257/98 |
| 8,819,930 | B2 | 9/2014 | Wunderlich et al. | |
| 2014/0042624 | A1* | 2/2014 | Zommer | H01L 24/03 257/741 |
| 2014/0054757 | A1* | 2/2014 | Ikuta | C25D 7/00 257/666 |
| 2014/0284779 | A1* | 9/2014 | Hayata | H01L 24/48 257/676 |
| 2015/0069600 | A1 | 3/2015 | Zhang | |

* cited by examiner

*Primary Examiner* — S. V. Clark

(57) ABSTRACT

A method of manufacturing a packaged semiconductor device includes patterning and plating silver nanoparticles in bonding areas of a lead frame, forming a hydrophilic group while oxidizing the silver nanoparticles, forming wire bonds on the silver nanoparticles, and encapsulating the wire bonds and the silver nanoparticles.

20 Claims, 5 Drawing Sheets

PACKAGED SEMICONDUCTOR DEVICE WITH A LEAD FRAME AND METHOD FOR FORMING

BACKGROUND

Field

This disclosure relates generally to semiconductor packaging, and more specifically, to lead frame packaging.

Related Art

Lead frame technology is commonly used in semiconductor packaging in which a die is attached to lead frame flag portion and connected with wire bonds to the lead posts of the lead frame. After formation of the wire bonds, a mold compound is formed over the die, wire bonds, and portion of the lead posts such that the wire bonds and die are completely covered by the mold compound. However, due to poor adhesion of the mold compound to the surface of the lead posts, the mold compound delaminates from the lead frame, causing damage to the wire bonds. For example, the stitch bonds of the wire bonds may crack or break, resulting in an electrical open. Therefore, a need exists for improved lead frame packaging which reduces delamination of the mold compound.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In order to improve adhesion between the mold compound and the lead post of lead frame, the surface is treated so as to create a hydrophilic surface. Prior to attaching the semiconductor die and wire bonds to the lead frame, nanoparticles of a conductive material are selectively plated onto the lead posts of the lead frame. The nanoparticles are subsequently oxidized. In one embodiment, a photoactive material is formed over the nanoparticles which, after attaching the die and forming the wire bonds but prior to forming mold compound, the lead frame with the photoactive material is exposed to illumination to active or create hydrophilic groups. In another embodiment, the nanoparticles are exposed to a plasma to provide oxidation. In this embodiment, the mold compound can be modified with a reducing agent which forms hydrophilic groups during the molding process. The hydrophilic groups include, for example, amino groups ($NH_2$) and hydroxyl groups (OH). The hydrophilic surface increases adhesion, such as in the case of silver nanoparticles.

Figure 1:
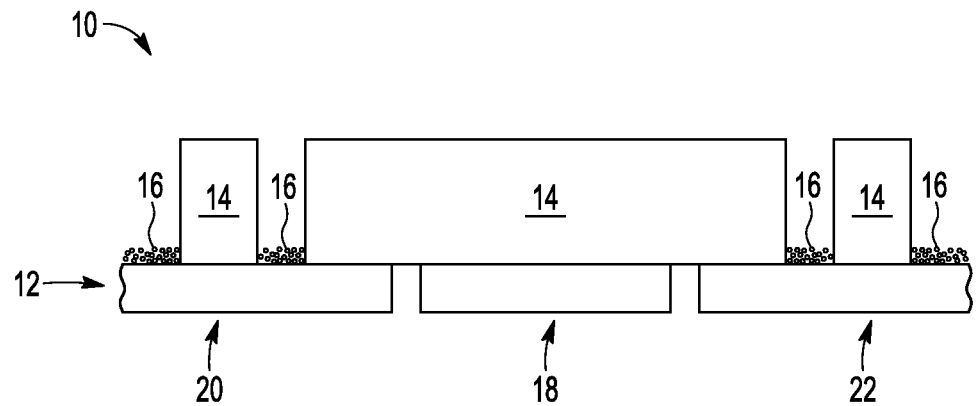
FIGS. 1-6 illustrate various stages of processing of a packaged semiconductor device in accordance with one embodiment of the present invention.

FIGS. 1-6 illustrate a semiconductor structure 10 at various stages in process in accordance with one embodiment of the present invention. FIG. 1 illustrates semiconductor structure 10 in which a patterned masking layer 14 is formed over a lead frame 12. Lead frame 12 includes a flag portion 18, a lead post 20, and a lead post 22. In one embodiment, lead frame 12 include copper, such as a copper alloy. Alternatively, lead frame 12 may include aluminum, nickel, nickel-palladium-gold, steel, etc. Flag portion 18 will receive a semiconductor die, and wire bonds will be formed between the lead posts and semiconductor die. Lead frame 12 includes any number of flag portions, and each flag portion is surrounded by two or more sides with lead posts. Lead frame can be in 1×N configuration to receive N semiconductor die or an M×N configuration to receive M×N semiconductor die, in which M and N can be any integer values. A patterned masking layer 14 is formed over lead frame 12 which includes opening to expose locations at which wire bonds will be attached. Patterned masking layer 14 may be formed with photoresist.

After formation of pattered masking layer 14, a layer of nanoparticles 16 is formed on lead frame 12, within the openings in patterned masking layer 14. The nanoparticles are of a conductive material. For example, in one embodiment, they are silver nanoparticles. The nanoparticles may have a size in range of 10 nm to 500 nm average diameter. The thickness of the layer of nanoparticles 16 may be in a range of 500 nm to 10,000 nm. Therefore, the nanoparticles are formed at locations at which a wire bond will be attached.

Figure 2:
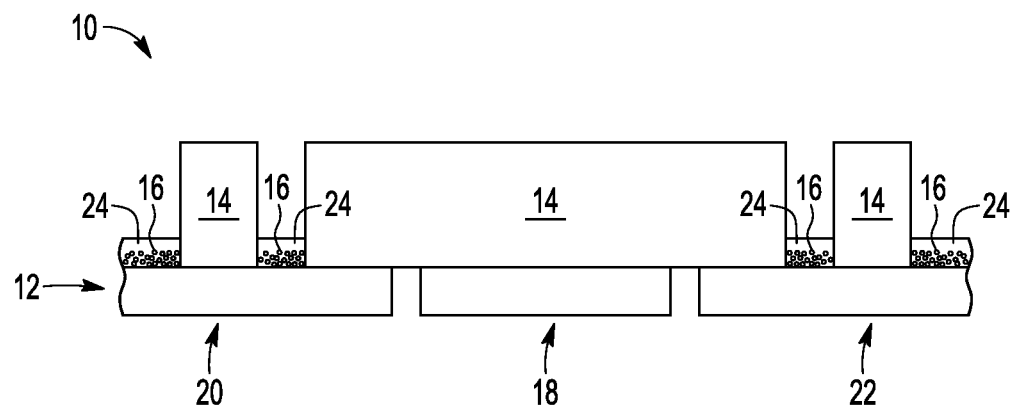

FIG. 2 illustrates semiconductor structure 10 at a subsequent stage in processing. A photoactive material coating 24 is formed over the nanoparticles 16 within the openings in patterned masking layer 14. The photoactive material includes compounds which can photochemically form hydroxyl or amino groups. In one embodiment, the photoactive material includes Coumarin derivatives, and coating 24 may have a thickness in a range of 10 nm to 1000 nm, or alternatively, 100 nm to 500 nm.

Figure 3:
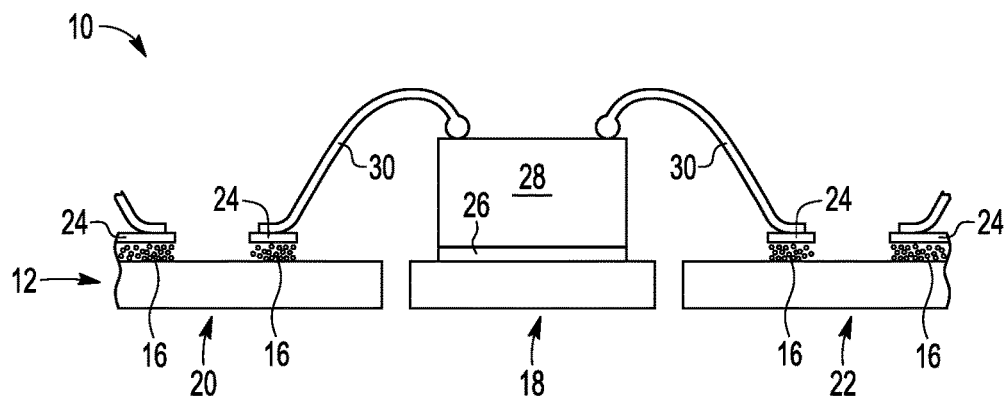

FIG. 3 illustrates semiconductor structure 10 at a subsequent stage in processing. First, patterned masking layer 14 is removed. A semiconductor die 28 is then attached with an adhesive layer 26 to flag portion 18 of lead frame 12. Wire bonds 30 are subsequently formed from the lead posts, such as lead posts 20 and 22, to a top surface of die 28. The portion of the wire bond which is attached to coating 24 on the lead posts may be a stitch bond. Alternatively, other bond forms may be used. Wire bonds are formed from the lead posts surrounding each die to the top surface of the corresponding die. Not all bond posts may have an attached wire bond. Each wire bond is attached over the nanoparticles and photoactive coating on the lead posts.

Figure 4:
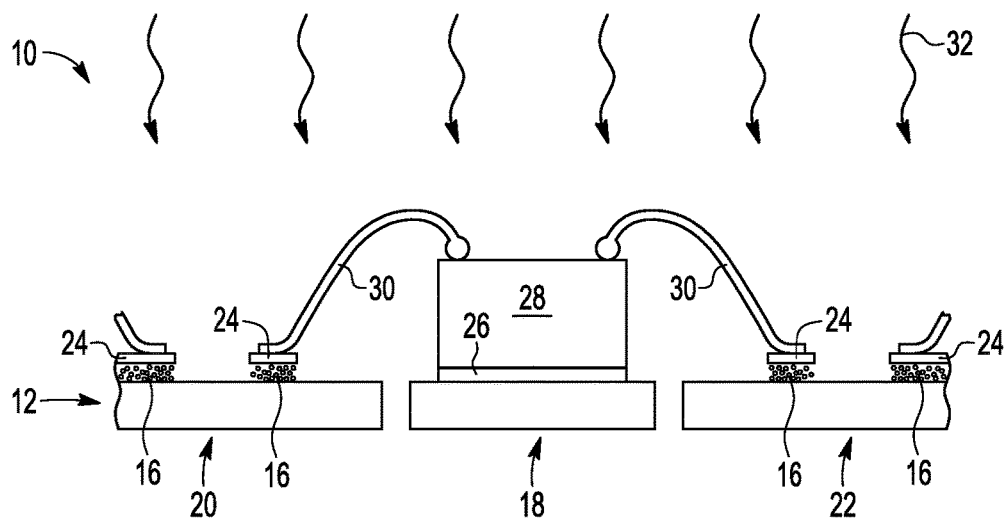

FIG. 4 illustrates semiconductor structure 10 at a subsequent stage in processing. After formation of the wire bonds, lead frame 12 is exposed to illumination 32 (also referred to as radiation) to activate photoactive material 24 and create hydrophilic groups such as $NH_2$ and OH. That is, the illumination may be performed after all packaging is complete up to the molding process. Hydrophilic groups are polar groups. Polar groups have a small charge separation with a small negative charge at the more electronegative atom while an equivalent slight positive charge at the less electronegative atom. Hydrophilic groups can form a chemical bond (hydrogen bond) with polar groups of the mold compound. Therefore, the creation of hydrophilic groups allows for improved adhesion of the subsequently formed molding compound to lead frame 12.

Figure 5:
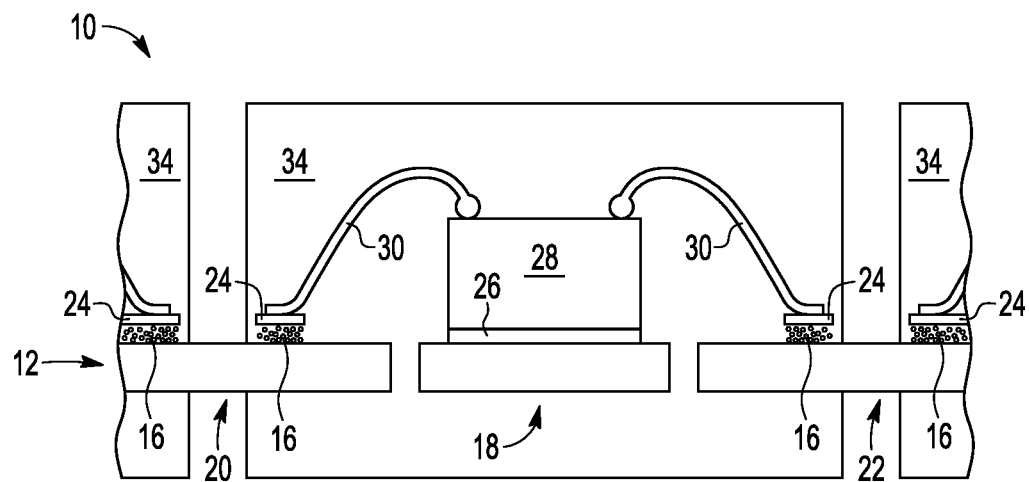

FIG. 5 illustrates semiconductor structure 10 at a subsequent stage in processing. A mold compound 34 is formed over a top surface of lead frame 12, covering the die, such as die 28, and the wire bonds, such as wire bonds 30. In the illustrated embodiment, mold compound 34 is also formed on the bottom surface of lead frame 12. However, in alternate embodiments, all or a portion of the bottom surface of lead frame 12 may remain exposed after formation of the mold compound to allow, for example, back side connections. Mold compound 34 may be formed with a molding tool and is formed such that openings expose the leads between the die. These openings align to the singulation lines of the lead frame.

Figure 6:
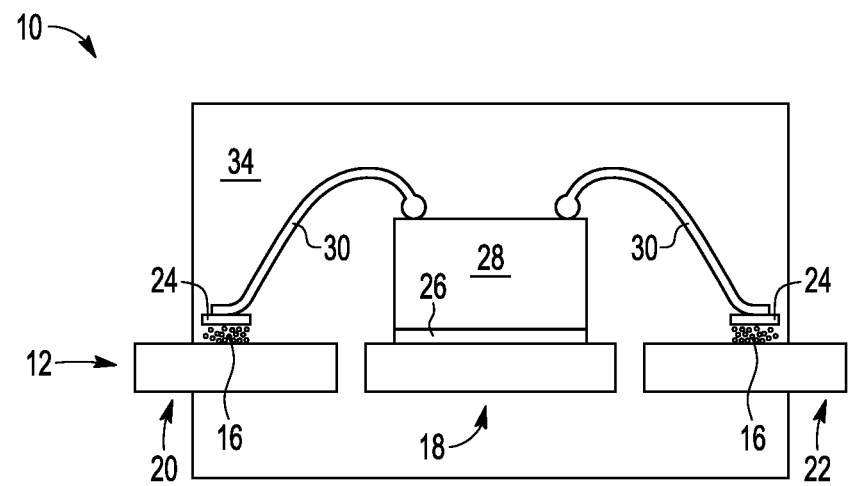

FIG. 6 illustrates semiconductor structure 10 at a subsequent stage in processing. Lead frame 12 is singulated such that each die and corresponding wire bonds are separated from neighboring die and corresponding wire bonds. Note that the length of the leads of lead frame 12 can be of any length, as needed. For example, after singulating, the lead posts extending from the mold compound can be bent into any shape, and therefore, may be designed to be any length. Semiconductor structure 10 is now a singulated packaged substrate. The singulated packaged substrate may then be attached to a printed circuit board.

In an alternate embodiment, a photoactive material coating, such as coating 24, is not used. For example, in the case where nanoparticles 16 are silver, the silver nanoparticles have a greater capability to absorb light. Therefore, even without the photoactive coating, illumination 32 can create hydrophilic bonds.

Figure 7:
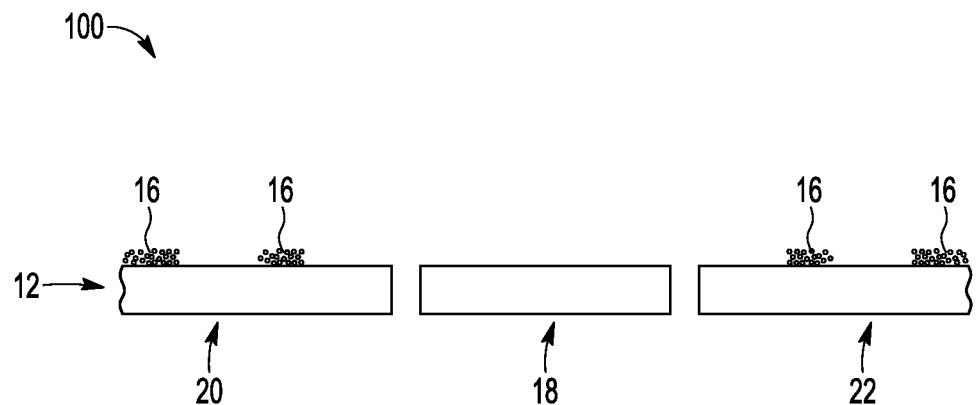
FIGS. 7-10 illustrate various stages of processing of a packaged semiconductor device in accordance with one embodiment of the present invention.

FIGS. 7-10 illustrate a semiconductor structure 100 at various stages in process in accordance with one embodiment of the present inventions. Note that like reference numbers with FIGS. 1-6 indicate like elements. FIG. 7 includes lead frame 12 with layer of nanoparticles 16, in which the nanoparticles are of a conductive material, such as silver. As described above, layer of nanoparticles 16 may be patterned and formed by first forming a patterned masking layer, such as layer 14, and then forming the nanoparticles on frame 12 within the openings of the patterned masking layer. As in the above embodiment, the nanoparticles are formed at locations at which wire bonds will be attached.

Figure 8:
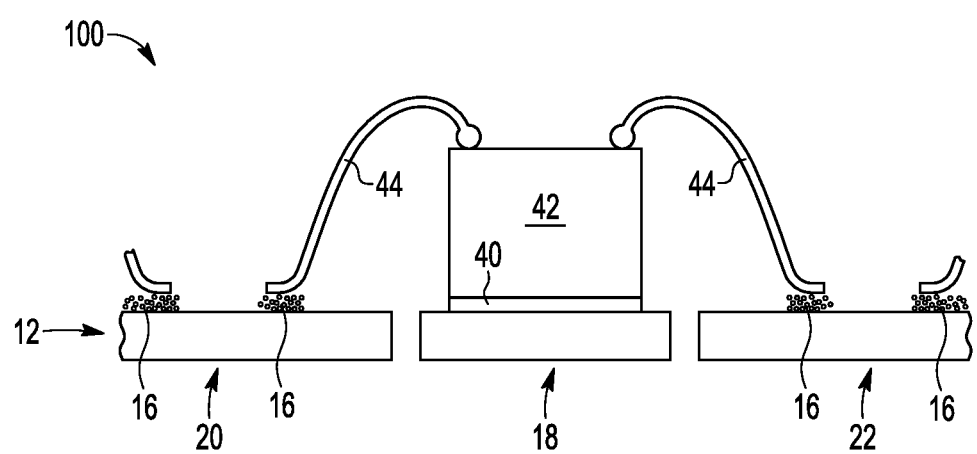

FIG. 8 illustrates semiconductor structure 100 at a subsequent stage in processing. A semiconductor die 42 is attached with an adhesive layer 40 to flag portion 18 of lead frame 12. Wire bonds 44 are subsequently formed from the lead posts, such as lead posts 20 and 22, to a top surface of die 42. Each wire bond is formed on a portion of nanoparticles 16. The portion of the wire bond which is attached to nanoparticles 16 on the lead posts may be a stitch bond. Alternatively, other bond forms may be used. Wire bonds are formed from the lead posts surrounding each die to the top surface of the corresponding die. Not all bond posts may have an attached wire bond.

Figure 9:
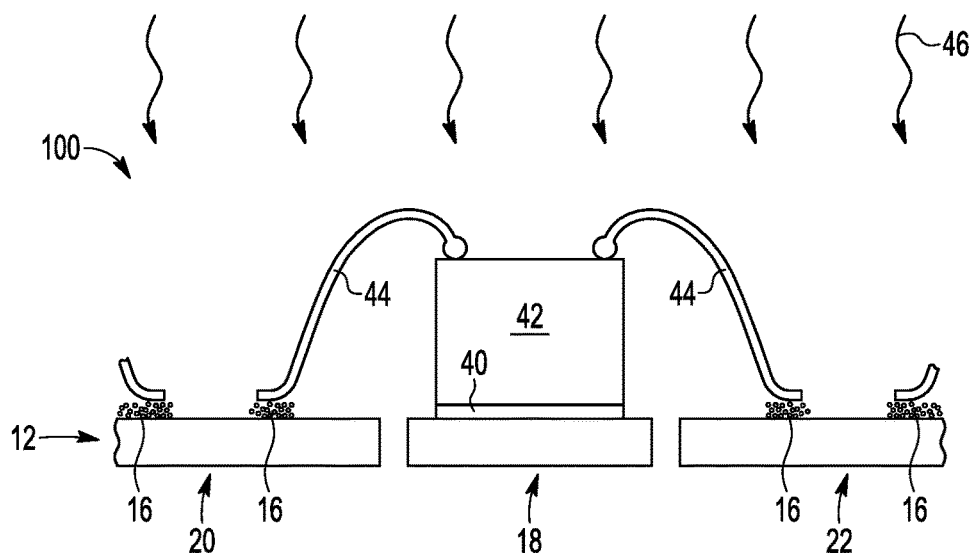

FIG. 9 illustrates semiconductor structure 100 at a subsequent stage in processing. Semiconductor structure 100 is exposed to a plasma 46 to oxide the surface. For example, in the case of silver nanoparticles, the exposure to plasma provides for the oxidation of the silver. The plasma may include nitrogen gas, hydrogen gas, or oxygen gas, or combinations thereof.

Figure 10:
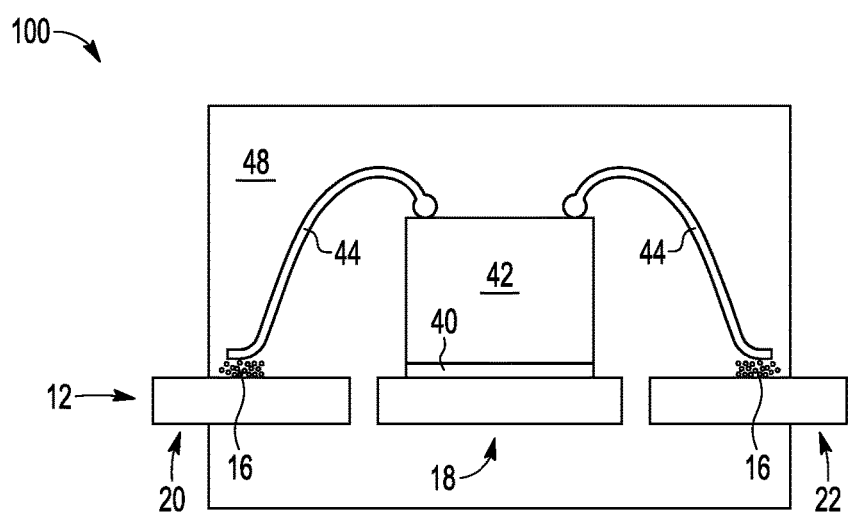

FIG. 10 illustrates semiconductor structure 100 at a subsequent stage in processing. A mold compound 48 is formed over a top surface of lead frame 12, covering the die, such as die 42, and the wire bonds, such as wire bonds 44. In the illustrated embodiment, mold compound 48 is also formed on the bottom surface of lead frame 12. However, in alternate embodiments, all or a portion of the bottom surface of lead frame 12 may remain exposed after formation of mold compound 48 to allow, for example, back side connections. Mold compound 48 has a modified mold composition with an added reducing agent to form hydrophilic groups during the molding process. This reducing agent may include ascorbic acid. Mold compound 48 may be formed with a molding tool and is formed such that openings expose the leads between the die. These openings align to the singulation lines of the lead frame.

FIG. 10 illustrates semiconductor structure 100 at a subsequent stage in processing. Lead frame 12 is singulated such that each die and corresponding wire bonds are separated from neighboring die and corresponding wire bonds. Note that, as with semiconductor structure 10, the length of the leads of lead frame 12 can be of any length, as needed. For example, after singulating, the lead posts extending from the mold compound can be bent into any shape, and therefore, may be designed to be any length. Semiconductor structure 100 is now a singulated packaged substrate. The singulated packaged substrate may then be attached to a printed circuit board.

Therefore, by now it can be understood how improved mold compound adhesion can be achieved. With the use of conductive nanoparticles, increased surface area is provided which provides increased surface oxide. This increased surface oxide allows for more hydrophilic groups for improved bonding of the compound material. For example, silver nanoparticles allows for improved adhesion of the mold compound for the above reasons as compared to regular plated silver. The addition of the reducing agent to the compound material and the photochemical process resulting from the light energy applied to the coated photoactive material also results in forming more hydrophilic surface groups for improved adhesion.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the photoactive coating my not be applied or the mold compound may not be modified with the reducing agent. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

A method of manufacturing a packaged semiconductor device includes depositing nanoparticles of conductive material on lead posts of a lead frame; oxidizing the nanoparticles; and forming wire bonds between contacts on a semiconductor die and the nanoparticles on the lead posts. In one aspect, the oxidizing the nanoparticles includes patterning photoresist with openings over the lead frame; coating the nanoparticles with a layer of photoactive material; and exposing the photoactive material to radiation. In a further aspect, the photoactive material is exposed to the radiation after the wire bonds are formed before the molding process. In another aspect, the oxidizing the nanoparticles includes forming a hydrophilic group on the nanoparticles. In a further aspect, the nanoparticles are exposed to plasma after the wire bonds are formed. In another aspect, the method further includes encapsulating the semiconductor die, nanoparticles and wire bonds in mold compound after the oxidizing the nanoparticles. In another aspect, a size of the nanoparticles is between 10 and 500 nanometers. In another aspect, the conductive material is silver. In a further aspect, the wire bonds are formed of one of a group consisting of: copper, silver, and gold. In another aspect, the conductive material is silver, and the plasma is one of a group consisting of: a mixture of hydrogen and nitrogen gas, and oxygen gas.

In another embodiment, a packaged semiconductor device includes a lead frame with a flag portion and lead posts surrounding the flag portion; a semiconductor die mounted on the flag portion; wire bonds between the lead posts and the semiconductor die; and silver nanoparticles in contact with stitches of the wire bonds, wherein the silver nanoparticles are between the stitches and the lead posts. In a further aspect, the packaged semiconductor device includes mold compound encapsulating at least a portion of the lead posts, semiconductor die, and the wire bonds. In another aspect, at least a portion of the silver nanoparticles are oxidized to form a hydrophilic group. In another aspect, a size of the silver nanoparticles is between 10 and 500 nanometers. In another aspect, the wire bonds are formed of copper.

In yet another embodiment, a method of manufacturing a packaged semiconductor device includes patterning and plating silver nanoparticles in bonding areas of a lead frame; forming a hydrophilic group while oxidizing the silver nanoparticles; forming wire bonds on the silver nanoparticles; and encapsulating the wire bonds and the silver nanoparticles. In a further aspect, the oxidizing the nanoparticles includes coating the nanoparticles with a layer of photoactive material; and exposing the photoactive material to radiation before the molding process. In another aspect, the oxidizing the nanoparticles includes exposing the nanoparticles to plasma after the wire bonds are formed. In another aspect, the wire bonds are formed of copper. In another aspect, the plasma is one of a group consisting of: a mixture of hydrogen and nitrogen gas, and oxygen gas.

What is claimed is:

1. A method of manufacturing a packaged semiconductor device comprising:
   depositing nanoparticles of conductive material on lead posts of a lead frame;
   oxidizing the nanoparticles;
   forming wire bonds between contacts on a semiconductor die and the nanoparticles on the lead posts.

2. The method of claim 1, wherein the oxidizing the nanoparticles includes:
   patterning photoresist with openings over the lead frame;
   coating the nanoparticles with a layer of photoactive material; and
   exposing the photoactive material to radiation.

3. The method of claim 2, wherein:
   the photoactive material is exposed to the radiation after the wire bonds are formed before the molding process.

4. The method of claim 1, wherein the oxidizing the nanoparticles includes:
   forming a hydrophilic group on the nanoparticles.

5. The method of claim 4, wherein:
   the nanoparticles are exposed to plasma after the wire bonds are formed.

6. The method of claim 1, further comprising:
   encapsulating the semiconductor die, nanoparticles and wire bonds in mold compound after the oxidizing the nanoparticles.

7. The method of claim 1, wherein:
   a size of the nanoparticles is between 10 and 500 nanometers.

8. The method of claim 1, wherein:
   the conductive material is silver.

9. The method of claim 8, wherein:
   the wire bonds are formed of one of a group consisting of: copper, silver, and gold.

10. The method of claim 1, wherein:
    the conductive material is silver, and
    the plasma is one of a group consisting of: a mixture of hydrogen and nitrogen gas, and oxygen gas.

11. A packaged semiconductor device comprising:
    a lead frame with a flag portion and lead posts surrounding the flag portion;
    a semiconductor die mounted on the flag portion;
    wire bonds between the lead posts and the semiconductor die; and
    silver nanoparticles in contact with stitches of the wire bonds, wherein the silver nanoparticles are between the stitches and the lead posts, and wherein at least a portion of the silver nanoparticles are oxidized to form a hydrophilic group.

12. The packaged semiconductor device of claim 11, further comprising:
    mold compound encapsulating at least a portion of the lead posts, semiconductor die, and the wire bonds.

13. A packaged semiconductor device comprising:
    a lead frame with a flag portion and lead posts surrounding the flag portion;
    a semiconductor die mounted on the flag portion;
    wire bonds between the lead posts and the semiconductor die; and
    silver nanoparticles in contact with stitches of the wire bonds, wherein the silver nanoparticles are between the stitches and the lead posts wherein a size of the silver nanoparticles is between 10 and 500 nanometers.

14. The packaged semiconductor device of claim 11, wherein the wire bonds are formed of copper.

15. A method of manufacturing a packaged semiconductor device comprising:
    patterning and plating silver nanoparticles in bonding areas of a lead frame;
    forming a hydrophilic group while oxidizing the silver nanoparticles;
    forming wire bonds on the silver nanoparticles; and
    encapsulating the wire bonds and the silver nanoparticles.

16. The method of claim 15, wherein the oxidizing the nanoparticles includes:
    coating the nanoparticles with a layer of photoactive material; and exposing the photoactive material to radiation before the molding process.

17. The method of claim 15, wherein the oxidizing the nanoparticles includes:

exposing the nanoparticles to plasma after the wire bonds are formed.

18. The method of claim 15, wherein:

the wire bonds are formed of copper.

19. The method of claim 17, wherein:

the plasma is one of a group consisting of: a mixture of hydrogen and nitrogen gas, and oxygen gas.

20. The packaged semiconductor device of claim 13, wherein the wire bonds are formed of copper.

\* \* \* \* \*